(12) United States Patent
Nishikawa (10) Patent No.: US 9,000,792 B2
(45) Date of Patent: Apr. 7, 2015

(54) INSPECTION JIG AND CONTACT

(76) Inventor: Hideo Nishikawa, Kyoto (JP)

(*) Notice: Subject to any disclaimer, the term of this patent is extended or adjusted under 35 U.S.C. 154(b) by 326 days.

(21) Appl. No.: 13/635,243

(22) PCT Filed: Aug. 24, 2011

(86) PCT No.: PCT/JP2011/069011
§ 371 (c)(1),
(2), (4) Date: Sep. 14, 2012

(87) PCT Pub. No.: WO2012/039226
PCT Pub. Date: Mar. 29, 2012

(65) Prior Publication Data
US 2013/0009658 A1      Jan. 10, 2013

(30) Foreign Application Priority Data
Sep. 21, 2010 (JP) .................... 2010-210682

(51) Int. Cl.
*G01R 1/067* (2006.01)
*G01R 1/073* (2006.01)
*G01R 31/28* (2006.01)

(52) U.S. Cl.
CPC ........ *G01R 1/06722* (2013.01); *G01R 1/06738* (2013.01); *G01R 1/07328* (2013.01); *G01R 31/2808* (2013.01)

(58) Field of Classification Search
CPC .......... G01R 1/06722; G01R 1/07314; G01R 1/07328
USPC .......................... 324/755.01, 755.11, 755.05
See application file for complete search history.

(56) References Cited

U.S. PATENT DOCUMENTS 6,034,532 A * 3/2000 Tarzwell .................. 324/755.05
6,323,667 B1  11/2001 Kazama
6,642,728 B1 * 11/2003 Kudo et al. .............. 324/755.02
(Continued)

FOREIGN PATENT DOCUMENTS

JP   63-058757 U   4/1988
JP       3369492  11/2002
JP   2006-208329 A   8/2006
(Continued)

OTHER PUBLICATIONS

International Search Report for the present PCT-US application No. PCT/JP2011/069011.
(Continued)

*Primary Examiner* — Patrick Assouad
*Assistant Examiner* — Demetrius Pretlow
(74) *Attorney, Agent, or Firm* — Sughrue Mion, PLLC (57) ABSTRACT

In an inspection jig (1) for electrical inspection of printed circuit boards, an electrode section (40) has an electrode (41) disposed on a surface of an electrode plate (42), and a contact (10) includes a conductive contact needle (11), a compression coil spring (12), and an intermediate member (13) that are arranged coaxially for use. The contact needle (11) has a distal end (111), a projection (112), a larger diameter portion (113), and an intermediate portion (114), and the intermediate member (13) has a cylindrical intermediate end (131), a guide portion (132), and an electrode end (133). The electrode end (133) has a cut section at an oblique angle, is bent to have a proximal end (133a) in the vicinity of a central portion, and is held by a contact holder (30) to have an initial load. The electrode (41) is smaller in diameter than the contact (10).

12 Claims, 5 Drawing Sheets

(56) References Cited

U.S. PATENT DOCUMENTS

| | | | |
|---|---|---|---|
| 2005/0052193 A1 | 3/2005 | Campbell | |
| 2007/0161285 A1* | 7/2007 | Saitou | 439/495 |

FOREIGN PATENT DOCUMENTS

| | | |
|---|---|---|
| JP | 2007-194187 A | 8/2007 |
| JP | 4031007 | 10/2007 |
| JP | 2008-039496 A | 2/2008 |
| JP | 2010-078432 A | 4/2010 |
| JP | 2010-281607 A | 12/2010 |
| JP | 2011/065930 | 7/2011 |

OTHER PUBLICATIONS

International Search Opinion for the present PCT-US application No. PCT/JP2011/069011.

International Search Report for PCT application No. PCT/JP2011/065930 (Foreign Patent Document No. 8), of which the applicant is the same as that of the present application No. PCT/JP2011/069011.

International Search Opinion for PCT application No. PCT/JP2011/065930 (Foreign Patent Document No. 8), of which the applicant is the same as that of the present application No. PCT/JP2011/069011.

* cited by examiner

INSPECTION JIG AND CONTACT

TECHNICAL FIELD

The present invention relates to contacts and inspection jigs to be contacted to electrode terminals provided in printed circuit boards, electronic components, and the like.

BACKGROUND ART

Figure 1:
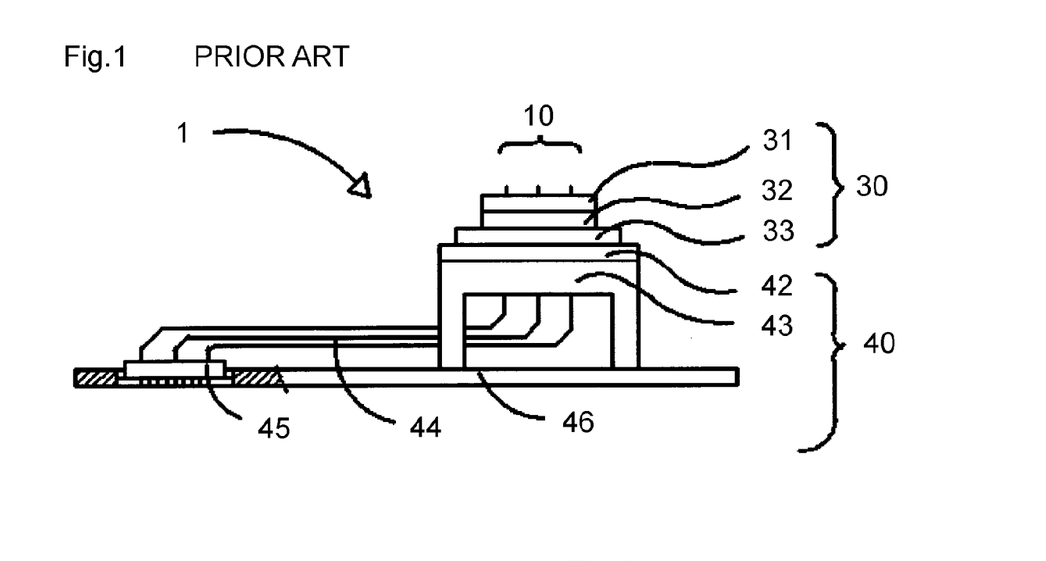
FIG. 1 is an explanatory diagram depicting an overall configuration of an inspection jig according to an embodiment of the present invention.

Description is given with reference to FIG. 1 of a general configuration of an inspection to be conducted on a printed circuit board. An inspection jig 1 is disposed between a printed circuit board to be inspected and an inspection device, so as to ensure conduction and allow inspection to be conducted regarding electrical properties such as a resistance value. A contact holder 30 and an electrode section 40 are connected with the inspection device by means of a connector 45. The contact holder 30 is configured to hold a plurality of contacts 10 that are adapted to conductively contact inspection terminals of the printed circuit board to be inspected. The electrode section 40 has electrodes and is configured to detachably support the contact holder 30 to establish conductive contact of the electrodes with the contacts 10. The configuration allowing separation of the contact holder 30 and the electrode section 40 is effective for fabrication and maintenance.

Figure 5:
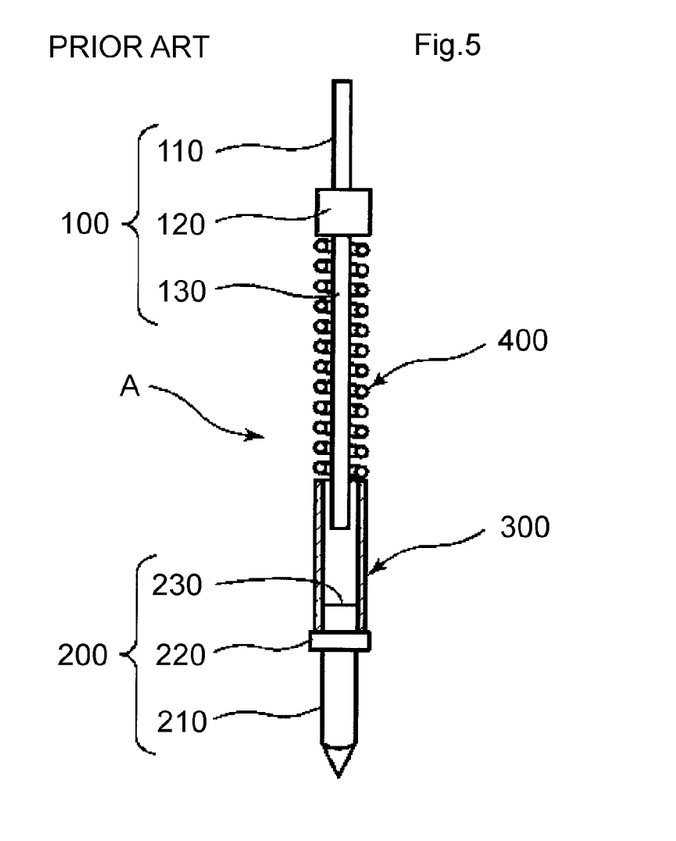
FIG. 5 is a cross-sectional view of a contact of a background invention.

Background art includes a perpendicular coil spring probe of Patent Document 1 wherein an attempt is made to improve direct current resistance and inductance (an alternate current resistance property) of the internal resistance of the probe, and a first embodiment thereof is depicted in FIG. 5. The probe includes an upper probe pin 100, a compression coil spring 400, a guide tube 300, and a lower probe pin 200, and the upper probe pin is contained in the guide tube, such that an attempt is made to improve the internal resistance. The number of component is however four and thus there is still room for cost reduction.

FIGS. 2, 3, and 4 of Patent Document 2 include a longitudinal cross-sectional view and an enlarged view of a contact pin portion of a test head that includes a contact pin (reference numeral 1 of Document 2), a coil spring (reference numeral S of Document 2), and a receiver pin (reference numeral 3 of Document 2). The number of components is three and, as in Patent Document 1, an attempt is made to improve the internal resistance by housing the contact pin in the receiver pin; however, with smaller dimensions of the components, processing an insertion hole (reference numeral 34 of Document 2) in the receiver pin is not easy.

FIG. 1 of Patent Document 3 depicts a perpendicular spring probe with two components, i.e., a contact pin (reference numeral 100A of Document 3) and a tubular body (reference numeral 200A of the document). A spring (reference numeral 230A of Document 3) is provided in a middle portion of the tubular body and a contact pin is contained in the tubular body, such that an attempt is made to improve the internal resistance. This configuration however involves higher cost because of additional provision of a conical connection cap (reference numeral 240B of the document) to the tubular body for reducing contact resistance. Non-use of a connection cap may increase the area of contact and hence invite connection failure due to insufficient contact pressure under a lower load condition.

FIG. 2 of Patent Document 4 depicts a contact including a bar-shaped member (reference numeral 21 of Document 4), a coil spring (reference numeral 23 of Document 4), and a connection terminal (reference numeral 24 of Document 4). The number of components is three, and the connection terminal has a tapered second end, such that even a small electrode is contacted therewith. The tapered shape is however not conical, and the contact condition is thus not certain, which may involve a higher level of skill in design to define the electrode area, load, and specifications for processing.

As described above, elaboration is made in various manners on conductive contact between the electrode of the electrode section 40 and the contact 10 of the inspection jig 1 and on the internal electrical properties of the contact 10, but there is still room for improvement.

CITATION LIST

Patent Document

Patent Document 1: JP-A-2006-208329
Patent Document 2: Japanese Patent No. 3369492
Patent Document 3: Japanese Patent No. 4031007
Patent Document 4: JP-A-2010-078432

SUMMARY OF THE INVENTION

Problems to be Solved by the Invention

With the recent miniaturization and higher density integration of printed circuit boards and electronic components, quality enhancement and miniaturization (i.e., higher unit price) of contacts, coupled with increased inspection points, have brought about significant rise in total price and cost for inspection jigs. The present invention was made in view of the foregoing circumstances and provides for an inspection jig and a contact for conducting electricity to a printed circuit board achieving simpler manufacture at lower cost and easy maintenance, as well as reliable conductive contact between the contact and the electrode with surely lower direct current resistance and lower inductance (an alternate current resistance property) with respect to internal electrical properties of the contact.

Solutions to Problems

An inspection jig according to a first aspect of the present invention includes a contact having a distal end adapted to contact an inspection terminal that is provided in an electronic component such as a printed circuit board, and an electrode section to be connected to an inspection device. The electrode section has a connector to be connected to the inspection device and electrodes wired from the connector. The electrode is arranged coaxially with an intermediate member on a surface of an electrode plate. The contact includes a conductive contact needle, a coil spring, and the intermediate member. The contact needle has a distal end, a projection, a stopping diameter portion (a larger diameter portion or a coupling portion), and an intermediate portion. The coil spring is formed of a compression coil spring. The intermediate member includes a cylindrical intermediate end, a guide portion, and an electrode end. The electrode end has a cut section at an oblique angle and is bent to have a proximal end in the vicinity of a central portion. The coil spring and the intermediate member are arranged in series on the outer periphery of the intermediate portion, in such a manner as to be held by a contact holder. The electrode end is removably mounted on the electrode section to have an initial load. The electrode is smaller in diameter than the contact.

A contact according to a second aspect of the present invention is a contact that has a distal end adapted to contact an inspection terminal that is provided in an electronic component such as a printed circuit board, the contact being configured to bring into contact at a proximal end thereof with an electrode that is connected to an inspection device. The contact includes a conductive contact needle, a coil spring, and an intermediate member that are arranged coaxially for use. The contact needle includes a distal end, a projection that is a shaft-shaped portion continuously provided from the distal end, a larger diameter portion with a larger diameter, and an intermediate portion. The coil spring includes a stopping end adapted to abut on the larger diameter portion, and a spring constant portion. The intermediate member has a cylindrical shape with a larger inner diameter than the intermediate portion. The intermediate member includes an intermediate end to abut on the spring constant portion, a guide portion continuously provided from the intermediate end so as to slide with the intermediate portion, and an electrode end to contact the electrode. The electrode end has a cut section at an oblique angle and is bent to have the proximal end in the vicinity of a central portion, and is adapted to be pressed into contact with the electrode and the inspection terminal so as to achieve conductive contact therewith.

A contact according to a third aspect of the present invention is a contact that has a distal end adapted to contact an inspection terminal that is provided in an electronic component such as a printed circuit board, the contact being configured to bring into contact at a proximal end thereof with an electrode that is connected to an inspection device. The contact includes a conductive contact needle, a coil spring, and an intermediate member that are arranged coaxially for use. The contact needle includes a distal end, a projection that is a shaft-shaped portion continuously provided from the distal end, a coupling portion, and an intermediate portion. The coil spring includes a stopping end to be coupled on the outer periphery of the coupling portion into integration with the contact needle, and a spring constant portion. The intermediate member has a cylindrical shape with a larger inner diameter than the intermediate portion. The intermediate member includes an intermediate end to abut on the spring constant portion, a guide portion continuously provided from the intermediate end so as to slide with the intermediate portion, and an electrode end to contact the electrode. The electrode end has a cut section at an oblique angle and is bent to have the proximal end in the vicinity of a central portion, and is adapted to be pressed into contact with the electrode and the inspection terminal so as to achieve conductive contact therewith.

A contact according to a fourth aspect of the present invention relates to the above-described contact in which the coil spring is a compression coil spring of a deformed wire with a rectangular wire cross section.

A contact according to a fifth aspect of the present invention includes a conductive contact needle and a conductive intermediate member that is disposed coaxially with the contact needle for use. The contact needle has a distal end that is adapted to contact an inspection terminal of an electronic component to be inspected, a projection that is a shaft-shaped portion continuously provided from the distal end, a larger diameter portion that has a larger diameter than the projection, and an intermediate portion that has a smaller diameter than the larger diameter portion. The intermediate member is a cylindrical member that has a larger inner diameter than the intermediate portion. The intermediate member has an intermediate end to abut at a first end of the intermediate member on the larger diameter portion, a spring constant portion of a compression coil spring that is continuously provided from the intermediate end, a guide portion to slide with the intermediate portion, and an electrode end to contact an inspection device. The electrode end has a cut section at an oblique angle and is bent to have a proximal end in the vicinity of a central portion.

A contact according to a sixth aspect of the present invention includes a conductive contact needle and a conductive intermediate member that is disposed coaxially with the contact needle for use. The contact needle has a distal end that is adapted to contact an inspection terminal of an electronic component to be inspected, a projection that is a shaft-shaped portion continuously provided from the distal end, and a coupling portion and an intermediate portion that are continuously provided from the projection. The intermediate member is a cylindrical member that has a larger inner diameter than the intermediate portion. The intermediate member has an intermediate end to be coupled at a first end of the intermediate member to the outer periphery of the coupling portion into integration with the contact needle, a spring constant portion of a compression coil spring that is continuously provided from the intermediate end, a guide portion to slide with the intermediate portion, and an electrode end to contact an inspection device. The electrode end has a cut section at an oblique angle and is bent to have a proximal end in the vicinity of a central portion.

The aspects of the present invention as described above are not necessarily comprehensive as to the present invention, and it should be appreciated that a broader concept may be applied to understand the present invention.

Advantageous Results of the Invention

According to the first aspect of the present invention, the proximal end of the electrode end of the cylindrical member is in the vicinity of a central portion, and thus reliable conductive contact is ensured even in a case of adopting a small electrode or of misalignment of the electrode. This means that in fabrication of the electrode section by using a lead such as a thin diameter enameled wire, use is possible of a lead with a smaller wire diameter which, although permitting occurrence of misalignment, ensures such a clearance that allows for facilitated insertion and adhesion to an electrode hole.

Since the electrode end has a cut section at an oblique angle, electrical properties comparable to those of a conical end are available without causing backflow of electric current. Because of the initial load, reliable conductive connection is ensured inside the contact, and in a case of using multiple contacts, reliability of connection is enhanced. As a guide plate or the contact holder is removable, assembly and maintenance are also facilitated.

According to any of the second to sixth aspects of the present invention, the contact needle and the intermediate member are overlapped with each other coaxially, achieving capacitive coupling and reduction in reactance of alternate current resistance in proportion with frequencies, and the configuration is adapted for connection at higher frequencies. Since the intermediate member is formed of a cylindrical member, fabrication thereof is easier, and since the electrode end has an oblique cut section and is bent to have a proximal end in the vicinity of a central portion, functions obtainable from both the cylindrical end and the conical end are achieved with higher quality and lower cost. Since the electrode end has an oblique cut section, the proximal end may be bent by, for example, a press, so as to be easily provided in the vicinity of the central portion.

According to the fourth, fifth, or sixth aspect of the present invention, since the coil spring is formed of a deformed wire with a rectangular cross section, the coil spring may be so configured to have the same outer diameter and the same inner diameter as those of the cylindrical member, such that the volume ratio is increased and the outer diameter of the contact is clearly definable. A smaller wire thickness allows for easier thinly rolling, and a larger wire width (in a direction of compression) provides for a higher spring constant, which is suitable for thin-diameter contacts. The outer diameter is reducible with the same inner diameter as that of a circular wire coil spring.

According to the first, third, or sixth aspect of the present invention, components are joined to form a stopping portion, such that the contact needle is producible by processing both ends of a bar-shaped member, thus achieving cost reduction.

According to the fifth or sixth aspect of the present invention, the contact is formed of two components, and cost reduction is thus achieved. Reliability is improved as well.

According to the sixth aspect of the present invention, the contact is configured integrally, and assembly and maintenance are remarkably facilitated.

An advantageous result of any of the various aspects of the present invention can constitute an advantageous result of another aspect, since the intermediate member that is commonly used throughout the aspects has a cylindrical shape, and since the electrode section is cut at an oblique angle and is bent then to have an endmost proximal end in the vicinity of the central portion.

Other objects, features, aspects, and advantages of the present invention will become more apparent with reference to the following detailed description and the accompanying drawings.

EMBODIMENTS OF THE INVENTION

Reliable conductive contact between the contact 10 and an electrode 41 is achieved in an easily manufacturable manner by using a cylindrical member. Description is given below of an inspection jig 1 and a contact 10 according to embodiments of the present invention with reference to the accompanying drawings.

First Embodiment

Figure 2:
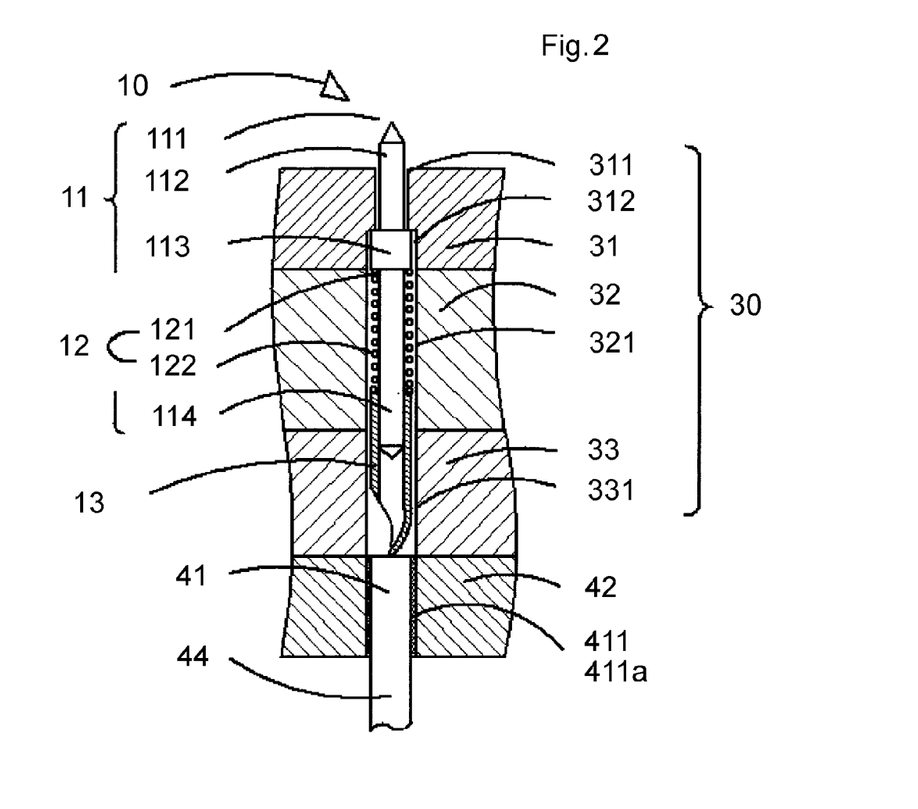
FIG. 2 is a cross-sectional view of an inspection jig according to a first embodiment of the present invention.

As depicted in FIG. 1, an inspection jig 1 using a contact 10 of the present invention has a plurality of contacts 10 held by a contact holder 30 to be detachably attached to an electrode plate 42. In the electrode plate 42, electrodes 41 as depicted in FIG. 2 are arranged coaxially with intermediate members 13 of the contacts 10 and secured to a support 43. The support 43 is secured to a jig base plate 46 together with connectors 45. The electrodes 41 and the connectors 45 are connected by leads 44 and constitute an electrode section 40. The inspection jig 1 is mounted on an inspection device to be electrically connected thereto by means of the connectors 45. The distal ends 111 of the contacts 10 pressingly contact inspection terminals of a printed circuit board to be inspected, thus allowing for measurement of electrical properties.

Description is given of an internal configuration with reference to FIG. 2. The contact 10 has a contact needle 11, a coil spring 12, and an intermediate member 13 arranged coaxially. The contact needle 11 of a conductive metal includes the distal end 111, a projection 112, a larger diameter portion 113, and an intermediate portion 114. The distal end 111 has a conical shape at an angle of 60 degrees for reliable conductive contact. The projection 112 projects in such a manner as to elongate and shrink from a guide hole 311 in a guide plate 31 of the contact holder 30 so as to reliably pressingly contact an inspection terminal of the printed circuit board to be inspected. The larger diameter portion 113 has a larger diameter than the guide hole 311 to be held by the contact holder 30, has an axial length of about 1 mm, and stops the coil spring 12 as well. The guide hole 311 corresponds to a specific example of a "guide portion" of the present invention. The lower edge on the guide hole 311 to be contacted by the upper surface of the larger diameter portion 113 corresponds to a specific example of a "stopping portion" of the present invention.

The intermediate portion 114 has an outer diameter that is a little smaller than the inner diameters of the coil spring 12 and the intermediate member 13 and extends from the larger diameter portion 113 in a direction opposite the projection 112, so as to coaxially guide the coil spring 12 and the intermediate member 13 from the inner side. The intermediate portion has a length that does not cause interference with an electrode end 133 of the intermediate member 13 during pressing contact and terminates in a conical shape at an angle of 90 degrees. The material thereof is SK4 and the surface is treated by gold plating; however, changes may be made thereto, as well as to the shape of the distal end thereof, according to use conditions.

The guide plate 31 is provided with a stopping position in such a manner that hole forming is performed into opposite directions to open the guide hole 311 and a guide through hole 312, where the guide hole 311 is configured to guide the distal end 111 to an inspection terminal of the printed circuit board to be inspected and to stop the larger diameter portion 113, and the guide through hole 312 has a diameter that allows for axial movement of the larger diameter portion 113. A coil spring holding hole 321 is opened coaxially with the guide through hole 312 in a coil holding plate 32 so as to have a diameter that allows for expansion and compression of the coil spring 12. Likewise, an intermediate member holding plate 33 has an intermediate member holding hole 331 opened therethrough. The intermediate member holding plate 33 is laid on the coil spring holding plate 32 and is aligned and screwed thereto, and then the guide plate 31 is laid on the coil spring holding plate 32 and is aligned and screwed thereto, such that the insulative contact holder 30 is formed. The coil spring holding hole 321 and the intermediate member holding hole 331 correspond to specific examples of a "tubularly caved portion" of the present invention.

The coil spring 12 is a compression coil spring formed of a conductive metal such as piano wire, has an inner diameter a little larger than the diameter of the intermediate portion 114, and includes a stopping end 121 and a spring constant portion 122. The stopping end 121 is configured to be stopped by the larger diameter portion 113, and the spring constant portion 122 has a spring property of the compression coil spring. The terminal processing of the both ends is closed-end non-polishing. The coil spring 12 biases the contact needle 11 to be held by the coil spring holding plate 32. The surface of the coil spring 12 is desirably treated by gold plating for reliable conductive contact with the contact needle 11 and the intermediate member 13.

The electrode 41 is processed in the following manner: A lead 44 such as an enameled wire is inserted in an electrode hole 411 in the electrode plate 42 that is coaxial with the intermediate member holding hole 331, fixed by use of an adhesive 411a, and flattened at the top thereof. In FIG. 2, the intermediate member 13 and the electrode 41 are in conductive contact in the vicinity of their coaxial central portion. The surface of the electrode 41 is also desirably treated by gold plating for reliable conductive contact.

In fabricating the electrode 41, providing a larger clearance between the lead wire 44 of a thin diameter and the electrode hole 411 facilitates insertion and adhesion, whereas could increase misalignment of the electrode 41. Although this fabrication technique permits misalignment that corresponds to the clearance which is appropriate for fabrication, the electrode 41 does not have to be a discrete unit and a smaller interelectrode distance is achieved. The diameter of the electrode hole 411 and the insulation distance add up to the interelectrode distance. The electrode holes 411 define a minimum inspection distance in the case the contacts 10 are held vertically.

The contact 10 is held by the contact holder 30 to be mounted on the electrode section 40; hence, the coil spring 12 is biased to provide an initial load prior to pressing contact. This configuration allows for reliable conductive contact of multiple contacts 10 where internally contacting portions, i.e., the larger diameter portion 113, the intermediate portion 114, the stopping end 121, the spring constant portion 122, an intermediate end 131, a guide portion 132, a proximal end 133a (see FIG. 3A), and the electrode 41 are in conductive contact.

Figures 3A, 3B:
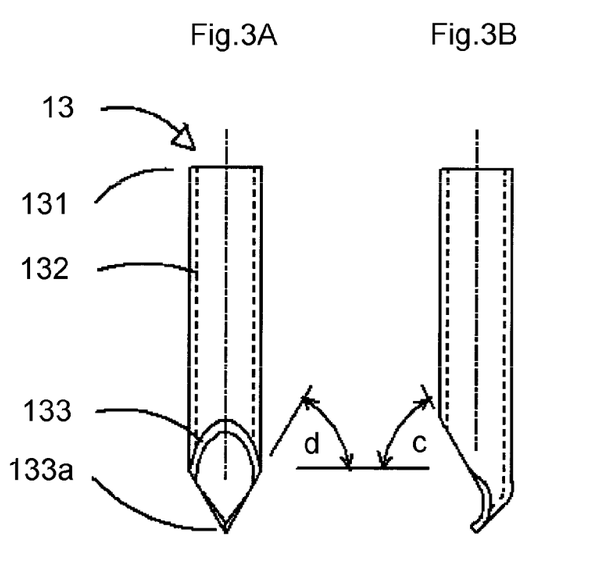
FIGS. 3A to 3C are explanatory diagrams depicting in an enlarged manner an intermediate member of the present invention.

The intermediate member 13 of the present invention is described with reference to FIGS. 3A to 3C. FIG. 3A is a front view of the intermediate member 13 formed of a cylindrical member that includes the intermediate end 131, the guide portion 132, the electrode end 133, and the proximal end 133a, where the intermediate end 131 is configured to stop the coil spring 11, the guide portion 132 is configured to contain the intermediate portion 114 of the contact needle 11 therein, the electrode end 133 is cut at an oblique angle and is bent in to a central portion, and the proximal end 133a is configured to contact the electrode 41 in the vicinity of the central portion. FIG. 3B is a side view thereof. The electrode end 133 corresponds to a specific example of a "portion of the intermediate member cut at an oblique angle" of the present invention, and the proximal end 133a corresponds to a specific example of an "endmost portion of the intermediate member" of the present invention.

Figure 3C:
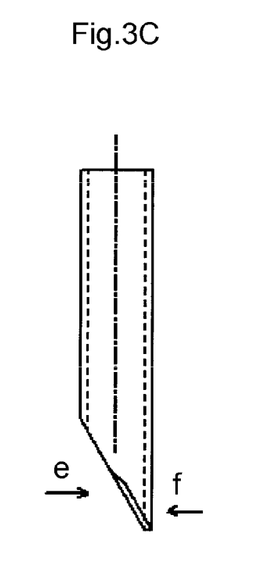

FIG. 3C is a side view of the cylindrical member being cut. Cutting is performed at an oblique angle c of −60 degrees, the cylindrical member is rotated by an angle of 90 degrees and cutting is performed at an oblique angled of 60 degrees, and the cylindrical member is rotated by 180 degrees and cutting is performed at the oblique angle d. The proximal end 133a is thus formed. The substantially front view thereof is close to FIG. 3A.

The proximal end 133a is then bent in to a central portion. The cylindrical member is fixed in the condition of FIG. 3C. An abutting tool with a raised shape is applied onto an inner surface of the cylindrical member in a direction e. Then, a pressing tool with a recessed shape, which tool is adapted not to abut on the proximal end 133a, is applied and pressed to a certain position in a direction f, and the tools are withdrawn to original positions. The cylindrical member is thus processed to the form shown in FIG. 3B to be the intermediate member 13.

The material preferably has sufficient hardness to withstand concentrated contact pressure, and is beryllium copper herein with good processability. The surface thereof is treated by gold plating for reliable conductive contact.

In pressing contact, the guide portion 132 of the intermediate member 13 and the intermediate portion 114 of the contact needle 11 slide on and guide each other so as to come into conductive contact, such that the facing area therebetween is maximum and capacitive coupling (alternate current coupling) occurs, resulting in reduction in effect of contact resistance and inductance (an alternate current resistance property) of the coil spring. The electric current that comes from the distal end 111 flows into the intermediate member 13 without experiencing resistance (i.e. without passing through the coil spring), so as to concentrate at the proximate end 133a into conductive contact with the electrode 41 and return to the inspection device. Since the electrode end 133 is cut obliquely, electricity flows without inversion, and since the proximal end 133a is in the vicinity of the central portion, the electrode 41 is provided with a smaller dimension similarly to a conical end, which allows for conductive contact despite misalignment.

An assembly and maintenance procedure are described with reference to FIGS. 1 and 2. The intermediate member holding plate 33 is aligned to and set on the coil spring holding plate 32 so as to be screwed thereto. Then, the plates are aligned to the electrode plate 42 of the electrode section 40 that has been completely assembled with the lead 44 fixed with the adhesive 411a and are fixed with screws. The proximal end 133a is first directed forward, and the intermediate member 13 as a whole is inserted through the coil spring holding hole 321. Subsequently, the coil spring 12 is inserted thereto. Finally, the intermediate portion 114 of the contact needle 11 is inserted forward. Then, the guide plate 31 is aligned to, set on, and secured by screws to the coil spring holding plate 32. Assembly is thus completed.

Replacement of a defective contact 10 is performed such that the guide plate 31 is detached so as to remove the contact needle 11, the coil spring 12, and the intermediate member 13, and a non-defective one is placed for replacement. In the case of failure in the electrode section 41, the inspection jig 1 is set at an angle of 90 degrees and the contact holder 30 is detached, and repair treatment is performed in an installation condition with the intermediate member holding plate 33 turned upward and the side of the distal end 11 is slightly lifted. In aligning the plates, although not shown in the figures, mechanical positions are defined by matching a plurality of positioning pins in a plurality of positioning holes. In a case where the contact holder 30 with the contacts 10 inserted therein is handled as a discrete unit, work is facilitated, while attention has to be made as all the contacts 10 will fall when the intermediate members 13 are turned down.

Second Embodiment

Figure 4:
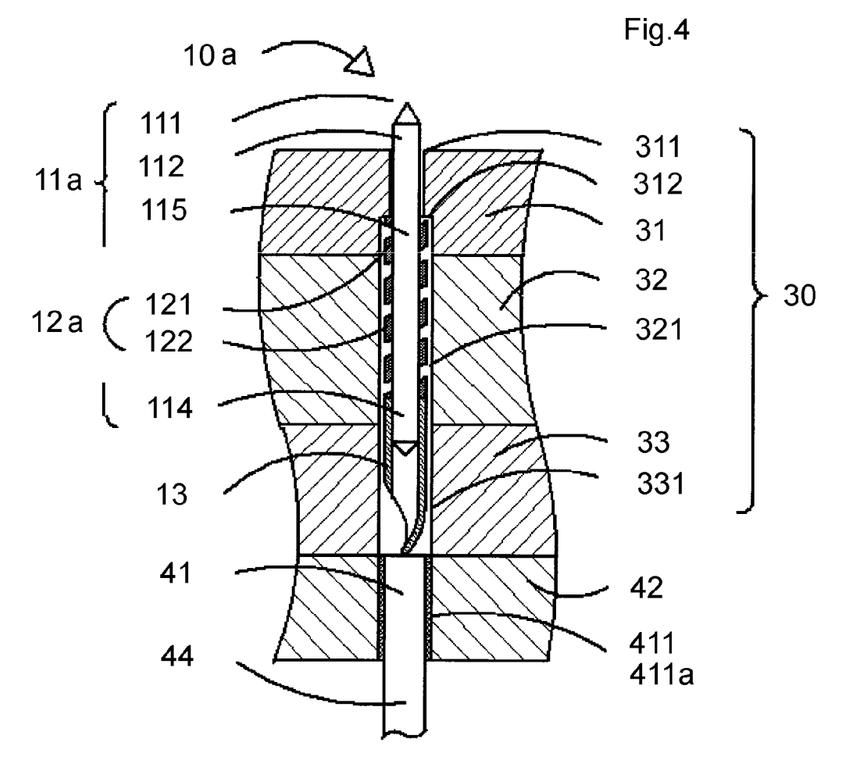
FIG. 4 is a cross-sectional view of an inspection jig according to a second embodiment of the present invention.

Description is given with reference to FIG. 4. A contact needle 11a is formed of a bar-shaped member of 0.1 mm to 0.2 mm and has a projection 111, a coupling portion 115, and an intermediate portion 114 on the outer periphery of the bar-shaped member with the same outer diameter. A coil spring 12a is provided in the form of a coil spring 12a of a deformed wire with a rectangular wire cross section. The material thereof is beryllium copper herein. The coil spring 12a has an inner diameter slightly larger than the diameter of the bar-shaped member, and the endfaces of both ends are treated by open-loop polishing and have their cut sections at a right angle with respect to the axial direction. A stopping end 121 of the coil spring 12a is inserted in the coupling portion 115 that is at the position corresponding to the position of the larger diameter portion 113 and joined thereto by, for example, welding, such that the stopping end 121 serves a function of being stopped by a contact holder 30. A spring constant portion 122 is guided by an intermediate portion 114 for expansion and compression upon receiving a load, so as to produce a spring load. A guide hole 311 corresponds to a specific example of the "guide portion" of the present invention. The lower edge on the guide hole 311 to come into contact with the stopping end 121 corresponds to a specific example of the "stopping portion" of the present invention.

Since thinly winding is easily performed and a higher spring load property is obtained as compared to a circular wire with the coil spring 12a of a deformed wire as depicted in FIG. 4 wherein the wire material thereof has a perpendicular thickness smaller than an axial width, the coil spring 12a is suitably used for contacts with thin diameters. The processing is simplified for the contact needle 11a because endface processing on both ends will suffice.

Third Embodiment

Figure 6:
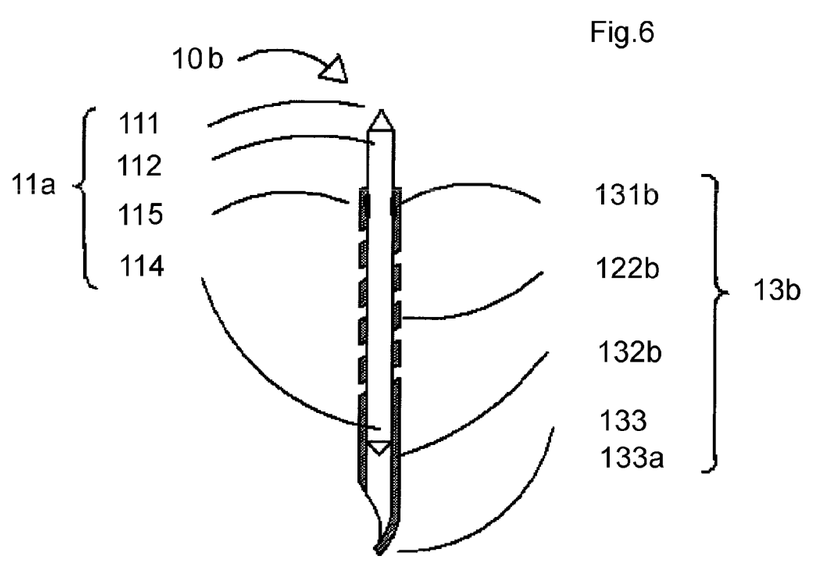
FIG. 6 is a cross-sectional view of a contact according to a third embodiment of the present invention.

Description is given with reference to FIG. 6. The contact needle 11a is the same as that of the second embodiment. An intermediate member 13b is a conductive cylindrical member with an inner diameter slightly larger than the diameter of the contact needle 11a and includes an intermediate end 131b, a spring constant portion 122b, a guide portion 132b, an electrode end 133, and a proximal end 133a in a continuous manner. The spring constant portion 122b is provided continuously along a middle portion of the cylindrical member. The electrode end 133 constitutes the proximal end 133a through a similar process to that in the first embodiment. The intermediate end 131b is joined to the contact needle 10a at a position of the coupling portion 115 of the contact needle 10a by, for example, welding, so as to be stopped to and held by a contact holder 30 as in the second embodiment. In the present embodiment, the contact needle 11a and the intermediate member 13b are joined to each other to provide an integrated contact 10b.

As to the manufacturing method of the intermediate member 13b, while the coil spring 12a of a deformed wire and the intermediate member 13 (see FIG. 4) may be joined together, cutting, etching, or electroforming (see the background art: JP-A-2010-281607 relating to an electroforming probe) is preferably performed on a cylindrical member to provide an integrated structure. The material is preferably a metal such as beryllium copper, copper, or nickel. The surface is herein treated by gold plating. Since the shape is cylindrical, joining to the coupling portion 115 (see non-published patent document of the same applicant: Japanese Patent Application No. 2010-203086 relating to soldering) is preferably performed by crimping (caulking) for its simplicity.

As to components, the contact 10b is configured to have two components, i.e., the contact needle 11a and the intermediate member 13b so as to achieve cost reduction. The reliability of electrical connection is also improved. Because of the integrated structure of the contact 10b, in maintenance, a defective contact 10b is easily replaceable upon detachment of a guide plate 31. Likewise, assembly is facilitated as well.

Fourth Embodiment

In the third embodiment, the stopping to the contact holder 30 is achieved with the intermediate end 131b joined to the coupling portion 115; however, also adoptable is a contact needle 11 of the first embodiment with a larger diameter portion 113 that is larger in diameter than the projection 111. Although not shown, the coil spring 12 and the intermediate member 13 in FIG. 2 are substituted to an intermediate member 13b (see FIG. 6) having a function of a compression coil spring. The intermediate end 131b is described as being closed end (cylindrical), whereas an open end configuration is also possible.

As other embodiments, while the contact needle 11a and the coil spring 12a of a deformed wire are joined together in the second embodiment, the contact needle may also be joined to a coil spring 12 of a circular wire. The components will easily be producible.

A reduced diameter of the stopping end 121 will allow for gripping of the larger diameter portion 113a in inserting the contact needle 11a, hence easy joining.

The foregoing description of specific embodiments of the present invention is presented for the illustrative purpose. The embodiments are intended neither to be comprehensive nor to restrict the present invention to the embodiments as literally described. Various modifications and changes are apparent to those skilled in the art in light of the foregoing description.

The present application is based on Japanese Patent Application No. 2010-210682 filed in Japan on Sep. 21, 2010 by the present applicant, the entire contents of which are hereby incorporated by reference. Further, Japanese Patent Application No. 2010-203086 filed in Japan on Sep. 10, 2010 by the present applicant is hereby incorporated by reference.

INDUSTRIAL APPLICABILITY

The contacts of the present invention are generally applicable to conduction jigs and conduction devices to be brought into conductive contact with inspection terminals provided in electronic components such as printed circuit boards, integrated circuit (IC) packages, and ICs.

REFERENCE SIGNS LIST 1 inspection jig
10, 10a, 10b contact
11, 11a contact needle
111 distal end
112 projection
113 larger diameter portion (stopping diameter portion)
114 intermediate portion
115 coupling portion (stopping diameter portion)
12, 12a coil spring
121 stopping end
122, 122b spring constant portion
13, 13b intermediate member
131, 131b intermediate end
132, 132b guide portion
133 electrode end
133a proximal end (endmost portion)
30 contact holder
31 guide plate
32 coil spring holding plate
33 intermediate member holding plate 40 electrode section
41 electrode

The invention claimed is:

1. A contact for use in an assembly of an inspection jig for inspection of an electronic component, the contact comprising:
   a conductive contact needle;
   a coil spring; and
   a conductive intermediate member,
   the contact needle having:
      a distal end adapted to contact an inspection portion of an electronic component to be inspected;
      a projection being a shaft-shaped portion continuously provided from the distal end;
      a larger diameter portion being a shaft-shaped portion continuously provided from the projection, the larger diameter portion having a larger diameter than the projection; and
      an intermediate portion being a shaft-shaped portion continuously provided from the larger diameter portion, the intermediate portion having a smaller diameter than the larger diameter portion, wherein
   the coil spring is disposed on the outer periphery of the intermediate portion and has a first end abutting on a surface at the side of the intermediate portion of the larger diameter portion, and
   the intermediate member is a cylindrical member disposed on the outer periphery of the intermediate portion to be slidably guided by the intermediate portion, the intermediate member having a first end and a second end, the first end of the intermediate member abutting on a second end of the coil spring, the second end of the intermediate member having a portion cut at an oblique angle and bent to have an endmost portion in the vicinity of a central portion.

2. The contact according to claim 1, wherein the coil spring is a compression coil spring formed of a deformed wire with a rectangular wire cross section.

3. The contact according to claim 2, wherein the second end of the coil spring is coupled to the first end of the intermediate member.

4. The contact according to claim 3, wherein the coil spring and the intermediate member are provided in an integral cylindrical shape.

5. A contact for use in an assembly of an inspection jig for inspection of an electronic component, the contact comprising:
   a conductive contact needle;
   a coil spring; and
   a conductive intermediate member,
   the contact needle having:
      a distal end adapted to contact an inspection portion of an electronic component to be inspected;
      a projection being a shaft-shaped portion continuously provided from the distal end;
      a coupling portion being a shaft-shaped portion continuously provided from the projection; and
      an intermediate portion being a shaft-shaped portion continuously provided from the coupling portion, wherein
   the coil spring is disposed on the outer periphery of the intermediate portion and has a first end coupled to the coupling portion, and
   the intermediate member is a cylindrical member disposed on the outer periphery of the intermediate portion to be slidably guided by the intermediate portion, the intermediate member having a first end and a second end, the first end of the intermediate member abutting on a second end of the coil spring, the second end of the intermediate member having a portion cut at an oblique angle and bent to have an endmost portion in the vicinity of a central portion.

6. The contact according to claim 5, wherein the coil spring is a compression coil spring formed of a deformed wire with a rectangular wire cross section.

7. The contact according to claim 6, wherein the second end of the coil spring is coupled to the first end of the intermediate member.

8. The contact according to claim 7, wherein the coil spring and the intermediate member are provided in an integral cylindrical shape.

9. An inspection jig for inspection of an electronic component, the inspection jig comprising:
   a plurality of contacts, each thereof being a contact comprising:
      a conductive contact needle;
      a coil spring; and
      a conductive intermediate member,
      the contact needle having:
         a distal end adapted to contact an inspection portion of an electronic component to be inspected;
         a projection being a shaft-shaped portion continuously provided from the distal end;
         a larger diameter portion being a shaft-shaped portion continuously provided from the projection, the larger diameter portion having a larger diameter than the projection; and
         an intermediate portion being a shaft-shaped portion continuously provided from the larger diameter portion, the intermediate portion having a smaller diameter than the larger diameter portion, wherein
      the coil spring is disposed on the outer periphery of the intermediate portion and has a first end abutting on a surface at the side of the intermediate portion of the larger diameter portion, and
      the intermediate member is a cylindrical member disposed on the outer periphery of the intermediate portion to be slidably guided by the intermediate portion, the intermediate member having a first end and a second end, the first end of the intermediate member abutting on a second end of the coil spring, the second end of the intermediate member having a portion cut at an oblique angle and bent to have an endmost portion in the vicinity of a central portion, and
   the inspection jig further comprising:
   a contact holder holding the plurality of contacts; and
   an electrode section coupled to the contact holder,
   the contact holder including:
      a plurality of guide portions, each thereof being for axially and slidably supporting the contact needle of a corresponding one of the plurality of contacts in such a manner that the distal end of the contact needle of the corresponding one of the plurality of contacts is exposed;
      a plurality of stopping portions, each thereof being configured to abut on a surface at the side of the projection of the larger diameter portion of the contact needle of a corresponding one of the plurality of contacts so as to stop the distal end from projecting further from a predetermined position; and
      a plurality of tubularly caved portions, each thereof containing the coil spring of the contact needle of a corresponding one of the plurality of contacts and the intermediate member of the corresponding one of the plurality of contacts, the electrode section including:
- an electrically insulative electrode plate coupled to the contact holder; and
- a plurality of shaft-shaped conductive electrodes secured to the electrode plate to pass through the electrode plate, each of the electrodes having a first endface adapted to abut on the endmost portion of the intermediate member of a corresponding one of the plurality of contacts to be electrically connected to the intermediate member and to bias the coil spring of the corresponding one of the plurality of contacts.

10. The inspection jig according to claim 9, wherein the electrode plate is provided with a plurality of through holes, each of which has the same diameter as and coaxial with a corresponding one of the tubularly caved portions, each of the plurality of electrodes has a diameter smaller than a maximum diameter of a corresponding one of the contacts, and the plurality of electrodes are received in the through holes and fixed in the through holes with adhesive.

11. An inspection jig for inspection of an electronic component, the inspection jig comprising:
a plurality of contacts, each thereof being a contact comprising:
- a conductive contact needle;
- a coil spring; and
- a conductive intermediate member, the contact needle having:
- a distal end adapted to contact an inspection portion of an electronic component to be inspected;
- a projection being a shaft-shaped portion continuously provided from the distal end;
- a coupling portion being a shaft-shaped portion continuously provided from the projection; and
- an intermediate portion being a shaft-shaped portion continuously provided from the coupling portion, wherein the coil spring is disposed on the outer periphery of the intermediate portion and has a first end coupled to the coupling portion, and the intermediate member is a cylindrical member disposed on the outer periphery of the intermediate portion to be slidably guided by the intermediate portion, the intermediate member having a first end and a second end, the first end of the intermediate member abutting on a second end of the coil spring, the second end of the intermediate member having a portion cut at an oblique angle and bent to have an endmost portion in the vicinity of a central portion, and the inspection jig further comprising:
a contact holder holding the plurality of contacts; and
an electrode section coupled to the contact holder,
the contact holder including:
- a plurality of guide portions, each thereof being for axially and slidably supporting the contact needle of a corresponding one of the plurality of contacts in such a manner that the distal end of the contact needle of the corresponding one of the plurality of contacts is exposed;
- a plurality of stopping portions, each thereof being configured to abut on the first end of the coil spring of a corresponding one of the plurality of contacts coupled to the coupling portion of the contact needle of the corresponding one of the plurality of contacts, so as to stop the distal end of the contact needle of the corresponding one of the plurality of contacts from projecting further from a predetermined position; and
- a plurality of tubularly caved portions, each thereof containing the coil spring of the contact needle of a corresponding one of the plurality of contacts and the intermediate member of the corresponding one of the plurality of contacts, the electrode section including:
- an electrically insulative electrode plate coupled to the contact holder; and
- a plurality of shaft-shaped conductive electrodes secured to the electrode plate to pass through the electrode plate, each of the electrodes having a first endface adapted to abut on the endmost portion of the intermediate member of a corresponding one of the plurality of contacts to be electrically connected to the intermediate member and to bias the coil spring of the corresponding one of the plurality of contacts.

12. The inspection jig according to claim 11, wherein the electrode plate is provided with a plurality of through holes, each of which has the same diameter as and coaxial with a corresponding one of the tubularly caved portions, each of the plurality of electrodes has a diameter smaller than a maximum diameter of a corresponding one of the contacts, and the plurality of electrodes are received in the through holes and fixed in the through holes with adhesive.

* * * * *